United States Patent
Abou-Kandil et al.

(10) Patent No.: US 8,866,003 B2
(45) Date of Patent: Oct. 21, 2014

(54) SOLAR CELL EMPLOYING AN ENHANCED FREE HOLE DENSITY P-DOPED MATERIAL AND METHODS FOR FORMING THE SAME

(75) Inventors: Ahmed Abou-Kandil, Elmsford, NY (US); Keith E. Fogel, Hopewell Junction, NY (US); Jee H. Kim, Los Angeles, CA (US); Mohamed Saad, White Plains, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/599,591

(22) Filed: Aug. 30, 2012

(65) Prior Publication Data

US 2012/0318339 A1   Dec. 20, 2012

Related U.S. Application Data

(63) Continuation of application No. 12/835,238, filed on Jul. 13, 2010.

(51) Int. Cl.
| | |
|---|---|
| H01L 31/0288 | (2006.01) |
| H01L 31/18 | (2006.01) |
| H01L 31/0368 | (2006.01) |
| H01L 31/075 | (2012.01) |
| H01L 31/0224 | (2006.01) |
| H01L 31/0376 | (2006.01) |
| H01L 31/0392 | (2006.01) |

(52) U.S. Cl.
CPC ........ *H01L 31/075* (2013.01); *H01L 31/03687* (2013.01); *Y02E 10/545* (2013.01); *H01L 31/022466* (2013.01); *H01L 31/1816* (2013.01); *H01L 31/03762* (2013.01); *H01L 31/1824* (2013.01); *H01L 31/03921* (2013.01); *Y02E 10/548* (2013.01); *H01L 31/03685* (2013.01)
USPC .................. 136/255; 438/72; 257/E31.128

(58) Field of Classification Search
USPC .......................................... 136/255
See application file for complete search history.

(56) References Cited

U.S. PATENT DOCUMENTS

| | | | |
|---|---|---|---|
| 2004/0187914 A1* | 9/2004 | Matsuda et al. | 136/255 |
| 2010/0269896 A1* | 10/2010 | Sheng et al. | 136/255 |
| 2011/0177648 A1 | 7/2011 | Tanner et al. | |
| 2012/0171852 A1 | 7/2012 | Yuan et al. | |

OTHER PUBLICATIONS

Meier et al., Determining Components of Series Resistance From Measurements on a Finished Cell, 2006, IEEE.*
Office Action dated Nov. 13, 2012 received in a related U.S. Appl. No. 12/835,238.

\* cited by examiner

*Primary Examiner* — Seahvosh Nikmanesh
(74) *Attorney, Agent, or Firm* — Scully, Scott, Murphy & Presser, P.C.; Louis J. Percello, Esq.

(57) ABSTRACT

A p-doped semiconductor layer of a photovoltaic device is formed employing an inert gas within a carrier gas. The presence of the inert gas within the carrier gas increases free hole density within the p-doped semiconductor layer. This decreases the Schottky barrier at an interface with a transparent conductive material layer, thereby significantly reducing the series resistance of the photovoltaic device. The reduction of the series resistance increases the open-circuit voltage, the fill factor, and the efficiency of the photovoltaic device. This effect is more prominent if the p-doped semiconductor layer is also doped with carbon, and has a band gap greater than 1.85V. The p-doped semiconductor material of the p-doped semiconductor layer can be hydrogenated if the carrier gas includes a mix of $H_2$ and the inert gas.

15 Claims, 11 Drawing Sheets

SOLAR CELL EMPLOYING AN ENHANCED FREE HOLE DENSITY P-DOPED MATERIAL AND METHODS FOR FORMING THE SAME

CROSS REFERENCE TO RELATED APPLICATION

This application is a continuation of U.S. patent application Ser. No. 12/835,238, filed Jul. 13, 2010 the entire content and disclosure of which is incorporated herein by reference.

BACKGROUND

The present invention relates to photovoltaic devices, and more particularly to photovoltaic devices including a high concentration of free holes and associated increase in the shift of energy band in a p-doped semiconductor material and methods of forming the same.

A photovoltaic device is a device that converts the energy of incident photons to electromotive force (e.m.f.). Typical photovoltaic devices include solar cells, which are configured to convert the energy in the electromagnetic radiation from the Sun to electric energy. Each photon has an energy given by the formula $E=h\nu$, in which the energy E is equal to the product of the Plank constant h and the frequency $\nu$ of the electromagnetic radiation associated with the photon.

A photon having energy greater than the electron binding energy of a matter can interact with the matter and free an electron from the matter. While the probability of interaction of each photon with each atom is probabilistic, a structure can be built with a sufficient thickness to cause interaction of photons with the structure with high probability. When an electron is knocked off an atom by a photon, the energy of the photon is converted to electrostatic energy and kinetic energy of the electron, the atom, and/or the crystal lattice including the atom. The electron does not need to have sufficient energy to escape the ionized atom. In the case of a material having a band structure, the electron can merely make a transition to a different band in order to absorb the energy from the photon.

The positive charge of the ionized atom can remain localized on the ionized atom, or can be shared in the lattice including the atom. When the positive charge is shared by the entire lattice, thereby becoming a non-localized charge, this charge is described as a hole in a valence band of the lattice including the atom. Likewise, the electron can be non-localized and shared by all atoms in the lattice. This situation occurs in a semiconductor material, and is referred to as photogeneration of an electron-hole pair. The formation of electron-hole pairs and the efficiency of photogeneration depend on the band structure of the irradiated material and the energy of the photon. In case the irradiated material is a semiconductor material, photogeneration occurs when the energy of a photon exceeds the band gap energy, i.e., the energy difference of a band gap of the irradiated material.

The direction of travel of charged particles, i.e., the electrons and holes, in an irradiated material is sufficiently random. Thus, in the absence of any electrical bias, photogeneration of electron-hole pairs merely results in heating of the irradiated material. However, an external field can break the spatial direction of the travel of the charged particles to harness the electrons and holes formed by photogeneration.

One exemplary method of providing an electric field is to form a p-i-n junction around the irradiated material. As negative charges accumulate in the p-doped region and positive charges accumulate in the n-doped region, an electric field is generated from the direction of the n-doped region toward the p-doped region. Electrons generated in the intrinsic region drift toward the n-doped region due to the electric field, and holes generated in the intrinsic region drift toward the p-doped region. Thus, the electron-hole pairs are collected systematically to provide positive charges at the p-doped region and negative charges at the n-doped region. The p-i-n junction forms the core of this type of photovoltaic device, which provides electromotive force that can power any device connected to the positive node at the p-doped region and the negative node at the n-doped region.

SUMMARY

A p-doped semiconductor layer of a photovoltaic device is formed employing an inert gas within a carrier gas. The presence of the inert gas within the carrier gas increases free hole density within the p-doped semiconductor layer. Increasing doping activation at an interface with a transparent conductive material layer resulting in facilitating tunneling current over the barrier, thereby significantly reducing the series resistance of the photovoltaic device. Promoting doping activation at p-doped semiconductor increases open-circuit voltage due to increase in built-in potential. Further, the increased in the band bending increases the tunneling current over the Schottky barrier. These effects reduce the series resistance and increase the fill factor, thereby increasing the efficiency of the photovoltaic device. These effects are more prominent if the p-doped semiconductor layer is also doped with carbon, and has a band gap greater than 1.85V. The p-doped semiconductor material of the p-doped semiconductor layer can be hydrogenated if the carrier gas includes a mix of $H_2$ and the inert gas.

According to an aspect of the present invention, a method of forming a photovoltaic device is provided, which includes: forming a transparent conductive material layer on a substrate; and forming a p-doped semiconductor layer on the transparent conductive material layer in the presence of a semiconductor-material-containing reactant and a carrier gas including an inert gas.

According to another aspect of the present invention, a photovoltaic device is provided, which includes: a transparent conductive material layer; a p-doped semiconductor layer contacting the transparent conductive material layer; an intrinsic semiconductor layer contacting the p-doped semiconductor layer; and an n-doped semiconductor layer contacting the intrinsic semiconductor layer, wherein a series resistance of the photovoltaic device is equal to, or less than, 10 Ohms-cm$^2$ at high carbon content in p-doped semiconductor layer, and even lower series resistances if the carbon content is less.

DETAILED DESCRIPTION

As stated above, the present invention relates to photovoltaic devices including a high concentration of free holes and associated increase in the shift of energy band in a p-doped semiconductor material and methods of forming the same, which are now described in detail with accompanying figures. Throughout the drawings, the same reference numerals or letters are used to designate like or equivalent elements. The drawings are not necessarily drawn to scale.

As used herein, a crystal structure is "microcrystalline" if the average grain size of the material is from 1 nm to 10 microns.

As used herein, an "inert gas" refers to He, Ne, Ar, Kr, Xe, or a combination thereof.

As used herein, a "hydrogenated" semiconductor material is a semiconductor material including incorporated hydrogen therein, which neutralizes dangling bonds in the semiconductor material and allows charge carriers to flow more freely.

As used herein, a "semiconductor-material-containing reactant gas" refers to a gas including at least one atom of Si, Ge, or components of a compound semiconductor material.

Figure 1:
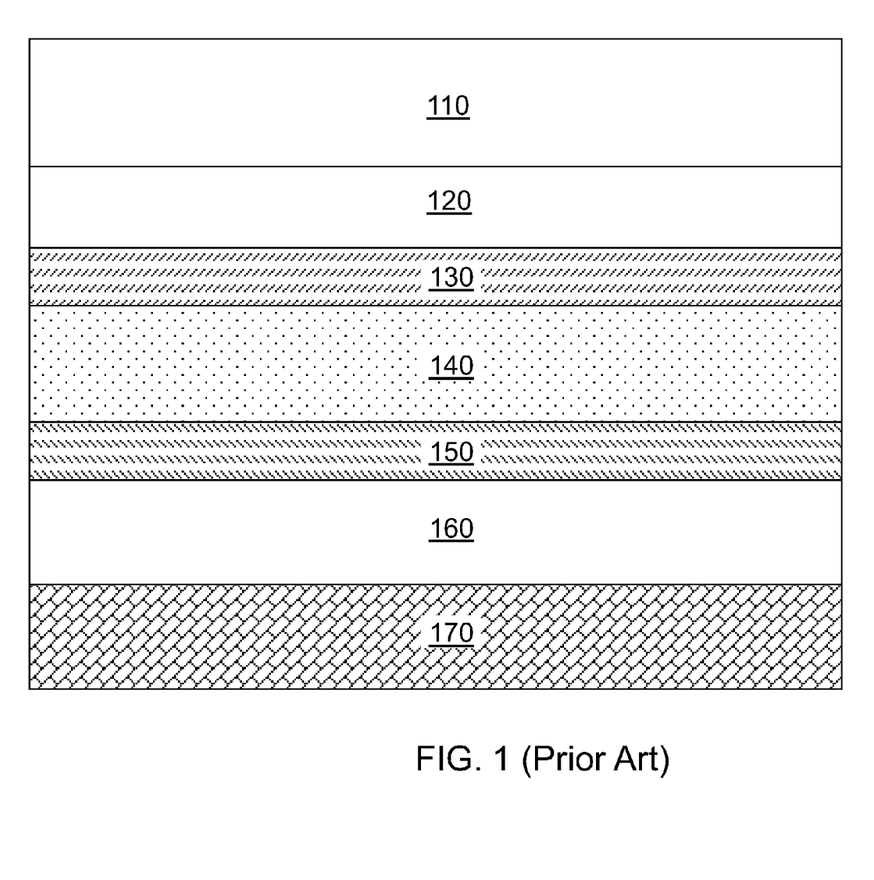
FIG. 1 is a vertical cross-sectional view of a prior art photovoltaic device structure.

Referring to FIG. 1, a prior art photovoltaic device structure includes a material stack, from top to bottom, of a substrate 110, a transparent conductive material layer 120, a p-doped semiconductor layer 130, an intrinsic semiconductor layer 140, an n-doped semiconductor layer 150, a first back reflector layer 160, and a second back reflector layer 170. The substrate 110 typically includes an optically transparent material. The transparent conductive material layer 120 functions as a positive node of the prior art photovoltaic device, and the combination of the second back reflector layer 170 functions as a negative node of the prior art photovoltaic device. The first back reflector layer 160 can be optically transparent, and the combination of the first and second back reflector layers (160, 170) reflect any photons that pass through the stack of the p-doped semiconductor layer 130, the intrinsic semiconductor layer 140, and the n-doped semiconductor layer 150 to enhance the efficiency of the prior art photovoltaic device.

The p-doped semiconductor layer 130 can include an amorphous p-doped hydrogenated silicon-containing material or microcrystalline p-doped hydrogenated silicon-containing material. The amorphous p-doped hydrogenated silicon-containing material or the microcrystalline p-doped hydrogenated silicon-containing material can be deposited by flowing a semiconductor-material-containing reactant in hydrogen carrier gas. In this case, hydrogen atoms are incorporated in the deposited material of the p-doped semiconductor layer 130. The p-doped semiconductor layer 130 can include an amorphous p-doped hydrogenated silicon-carbon alloy or a microcrystalline p-doped hydrogenated silicon-carbon alloy.

Figure 2:
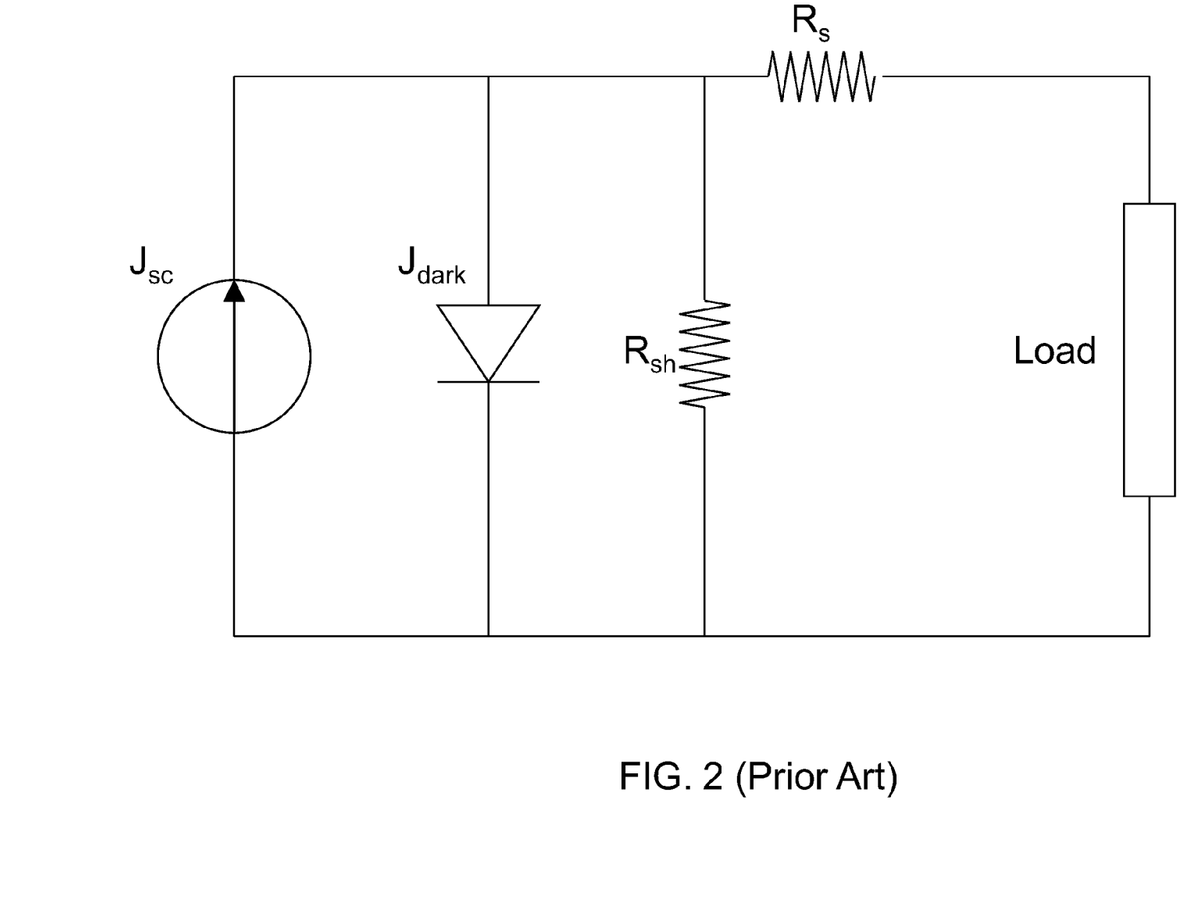
FIG. 2 is an equivalent circuit for the prior art photovoltaic device structure of FIG. 1.

Referring to FIG. 2, the functionality of the prior art photovoltaic device of FIG. 1 can be approximated by an equivalent circuit that includes a current source, a diode, and two resistors. The equivalent circuit of FIG. 2 approximates a unit area of the prior art photovoltaic device of FIG. 1, which provides electrical current that is proportional to the total irradiated area of the prior art photovoltaic device. The photovoltaic current per unit area generated by the prior art photovoltaic device is referred to as a short-circuit current density $J_{sc}$, i.e., the current density generated by the prior art photovoltaic device if the positive node and the negative node of the prior art photovoltaic device are electrically shorted. Thus, the current source in FIG. 2 generates an electrical current with a current density of the short-circuit current density $J_{sc}$.

Power dissipation through internal leakage current is approximated by a shunt resistance $R_{sh}$. A finite value for the shunt resistance $R_{sh}$ triggers an internal leakage current through the prior art photovoltaic device of FIG. 1, and degrades the performance of the prior art photovoltaic device. The lesser the shunt resistance $R_{sh}$, the greater is the internal power loss due to the internal leakage current.

Power dissipation through internal resistance of the prior art photovoltaic device of FIG. 1 is approximated by a series resistance $R_s$. A non-zero value for the series resistance $R_s$ triggers Joule loss within the prior art photovoltaic device. The greater the series resistance $R_s$ the greater is the internal power loss due to the resistance of the prior art photovoltaic device.

Referring back to FIG. 1, a predominant portion of the series resistance Rs is the resistance of a Schottky barrier at the interface between the transparent conductive material layer 120 and the p-doped semiconductor layer 130 when carbon content in p-doped semiconductor is high, e.g., greater than 1% in atomic concentration. The Schottky barrier dominates the total value of the series resistance Rs unless significant defects in conductive components, e.g., the transparent conductive material layer 120 or the first and second back reflector layers (160, 170), causes the series resistance Rs to increase abnormally and unless top and bottom contact of solar cells structures are conductive enough so that there is no external resistance problem. Thus, in well-functioning prior art photovoltaic devices of FIG. 1, the series resistance Rs is limited by the resistance introduced by the Schottky barrier at the interface between the transparent conductive material layer 120 and the p-doped semiconductor layer 130.

In case amorphous hydrogenated carbon-containing silicon alloy is employed for the p-doped semiconductor layer 130, the series resistance Rs of the prior art photovoltaic device of FIG. 1 is normally more than 20 Ohms-cm2 when carbon content is high and ZnO:Al is employed as the transparent conductive oxide (TCO). ZnO:Al is the most common TCO for a-Si:H solar cells application due to high transmittance and excellent durability in H2 plasma. ZnO:Al has a work function of 4.2 eV~4.5 eV. Another common TCO is $SnO_2$:F. $SnO_2$:F has a function of 4.7 eV~4.8 eV. $SnO_2$:F is more durable at high carbon contents, but still there is a barrier problem if the carbon content at the p-doped semiconductor layer increases. The data presented in this disclosure is based on exemplary structures employing ZnO:Al. However, including carbon at a high concentration, e.g., greater than 1% in atomic concentration, in the p-doped semiconductor layer is beneficial for performance of a photovoltaic device since the carbon atoms increase the band gap, resulting in minimizing absorption at electrically dead p-type layer and increases built-in potential. Both effects promote $J_{sc}$ and $V_{oc}$, respectively. In case microcrystalline hydrogenated carbon-containing silicon alloy is employed for the p-doped semiconductor layer 130, the series resistance Rs of the prior art photovoltaic device of FIG. 1 is normally more than 10 Ohms-cm$^2$ when carbon content is high ($E_g$>~1.9 eV). In general, photovoltaic devices containing carbon at a high concentration in the p-doped semiconductor layer increases Schottky barrier.

The potential difference between the positive node, i.e., the p-doped semiconductor layer 130, and the negative node, i.e., the n-doped semiconductor layer 150, generates an internal current that flow in the opposite direction to the photocurrent, i.e., the current represented by the current source having the short-circuit current density $J_{sc}$. The dark current has the same functional dependence on the voltage across the current source as a diode current. Thus, the dark current is approximated by a diode that allows a reverse-direction current. The density of the dark current, i.e., the dark current per unit area of the prior art photovoltaic device, is referred to as the dark current density $J_{dark}$. An external load can be attached to an outer node of the series resistor and one of the nodes of the current source. In FIG. 2, the value the impedance of the load is the value of the actual impedance of a physical load is divided by the area of the prior art photovoltaic cell because the equivalent circuit of FIG. 2 describes the functionality of a unit area of the prior art photovoltaic cell.

Figure 3:
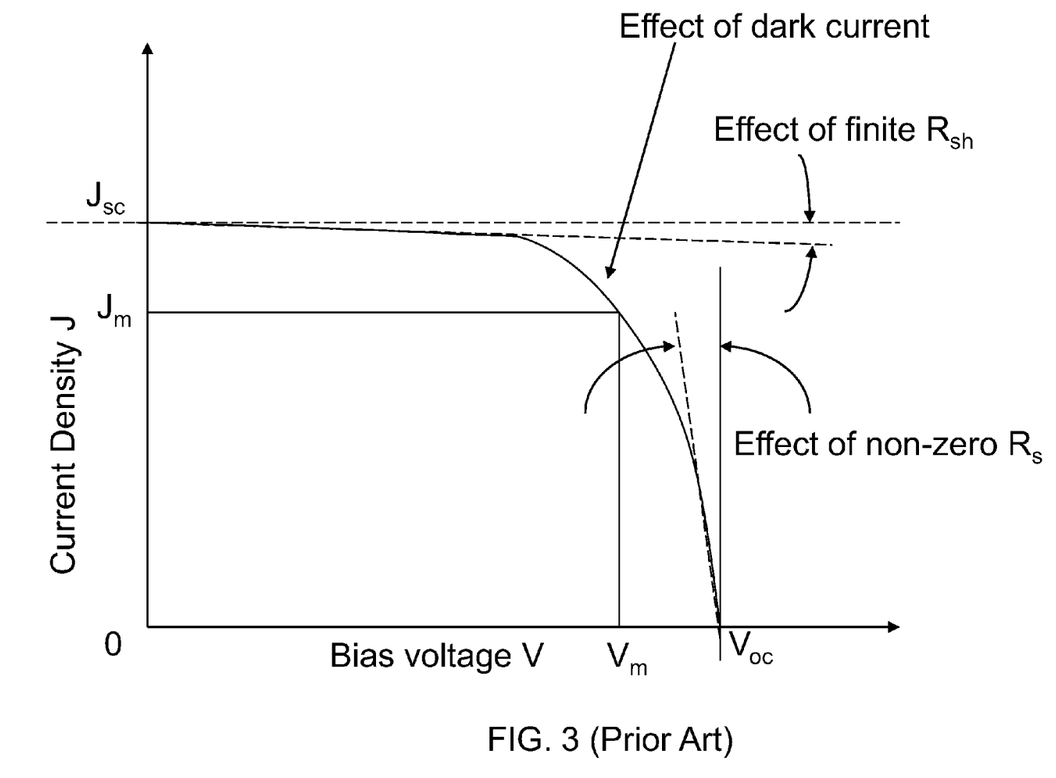
FIG. 3 is a schematic graph of an I-V curve of the prior art photovoltaic device structure of FIG. 1.

Referring to FIG. 3, a schematic graph of an I-V curve of the prior art photovoltaic device structure of FIG. 1 is shown. The bias voltage V is the voltage across the load in the equivalent circuit of FIG. 2. The open circuit voltage Voc corresponds to the voltage across the load as the resistance of the load diverges to infinity, i.e., the voltage across the current source when the load is disconnected. The inverse of the absolute value of the slope of the I-V curve at V=0 and J=$J_{sc}$ is approximately equal to the value of the shunt resistance $R_{sh}$. The inverse of the absolute value of the slope of the I-V curve at V=$V_{oc}$ and J=0 is approximately equal to the value of the series resistance $R_s$. The effect of the dark current is shown as an exponential decrease in the current density J as a function of the bias voltage V around a non-zero value of the bias voltage.

The operating range of a photovoltaic device is the portion of the I-V curve in the first quadrant, i.e., when both the bias voltage V and the current density J are positive. The power density P, i.e., the density of power generated from an unit area of the prior art photovoltaic device of FIG. 1, is proportional to the product of the voltage V and the current density J along the I-V curve. The power density P reaches a maximum at a maximum power point of the I-V curve, which has the bias voltage of $V_m$ and the current density of $J_m$. The fill factor FF is defined by the following formula:

$$FF = \frac{J_m \times V_m}{J_{sc} \times V_{oc}}. \qquad \text{(Eq. 1)}$$

The fill factor FF defines the degree by which the I-V curve of FIG. 3 approximates a rectangle. The fill factor FF is affected by the series resistance $R_s$ and the shunt resistance $R_{sh}$. The smaller the series resistance $R_s$, the greater the fill factor FF. The greater the shunt resistance $R_{sh}$, the greater the fill factor FF. The theoretical maximum for the fill factor is 1.0.

The efficiency η of a photovoltaic device is the ratio of the power density at the maximum power point to the incident light power density $P_s$. In other words, the efficiency η is given by:

$$\eta = \frac{J_m \times V_m}{P_s}. \qquad \text{(Eq. 2)}$$

Eq. 2 can be rewritten as:

$$\eta = \frac{J_{sc} \times V_{oc} \times FF}{P_s}. \qquad \text{(Eq. 3)}$$

Thus, the efficiency h of a photovoltaic device is proportional to the short circuit current density $J_{sc}$, the open circuit voltage $V_{oc}$, and the fill factor FF.

The efficiency η of a photovoltaic device depends on the spectral composition of the incident light. For solar cells, the efficiency is calculated under a standard radiation condition defined as 1 sun, which employs the spectrum of the sunlight.

Figure 4:
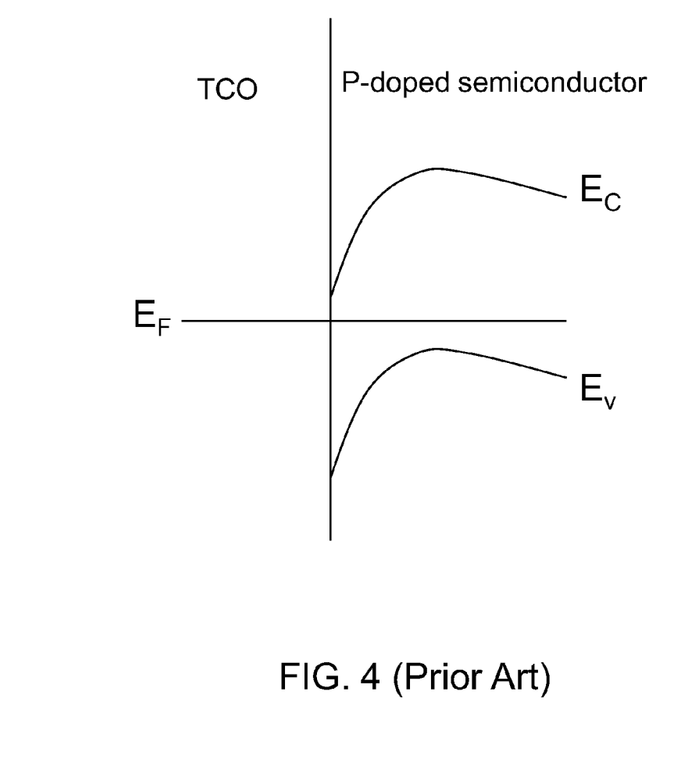
FIG. 4 is a band diagram of a transparent conductive material layer and a p-doped semiconductor layer in the prior art photovoltaic device structure of FIG. 1.

Referring to FIG. 4, a band diagram illustrates the band bending in the p-doped semiconductor layer 130 in the prior art photovoltaic device structure of FIG. 1 due to the transparent conductive material layer 120. Materials currently available for the transparent conductive material layer 120 are n-type materials. A Schottky barrier exits at the interface between the transparent conductive material layer 120 and the p-doped semiconductor layer 130. The valence band the conduction band of the p-doped semiconductor layer 130 bends downward at the interface between the transparent conductive material layer 120 and the p-doped semiconductor layer 130.

In case the transparent conductive material layer 120 is an aluminum-doped zinc oxide, the work function of the transparent conductive material layer 120 is about 4.5 eV. In other words, the Fermi level $E_F$ is at 4.5 eV below the vacuum level. Other typical materials for the transparent conductive material layer 120 also have a work function of about 4.5 eV.

In case the p-doped semiconductor layer 130 includes a hydrogenated amorphous silicon carbon alloy, the band gap of the p-doped semiconductor layer 130 is typically more than 1.8 eV. Therefore valence band edge is greater than 5.8 eV below vacuum level. The difference between the Fermi level of contac material and the valence band edge of the hydrogenated amorphous silicon carbon alloy is more than 1.3 eV. This is a significant energy barrier, and is the cause of the predominant component of the series resistance.

Figure 5:
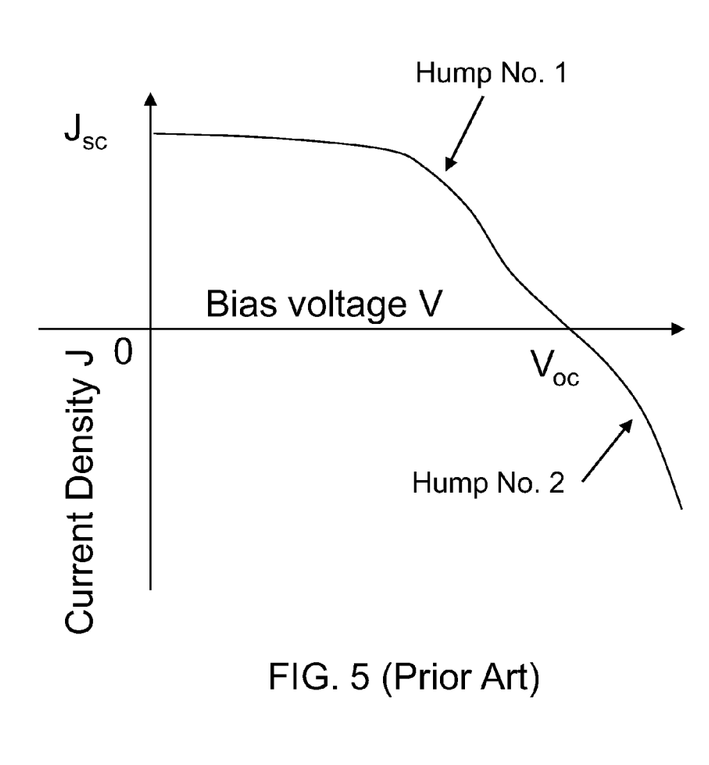
FIG. 5 is a graph of an I-V curve for an exemplary prior art photovoltaic device structure.

Referring to FIG. 5, the significant series resistance Rs in the prior art photovoltaic device of FIG. 1 can be manifested as humps in an I-V curve in case the p-doped semiconductor layer 130 includes an hydrogenated amorphous silicon carbon alloy with a high carbon content, e.g., a carbon content at an atomic concentration greater than 1%. The portion of the I-V curve in the fourth quadrant can be obtained by applying an external voltage across the positive and negative terminals of the prior art photovoltaic device of FIG. 1. The hump in the first quadrant can adversely affect the fill factor FF, and consequently affect the efficiency r adversely.

Figure 6:
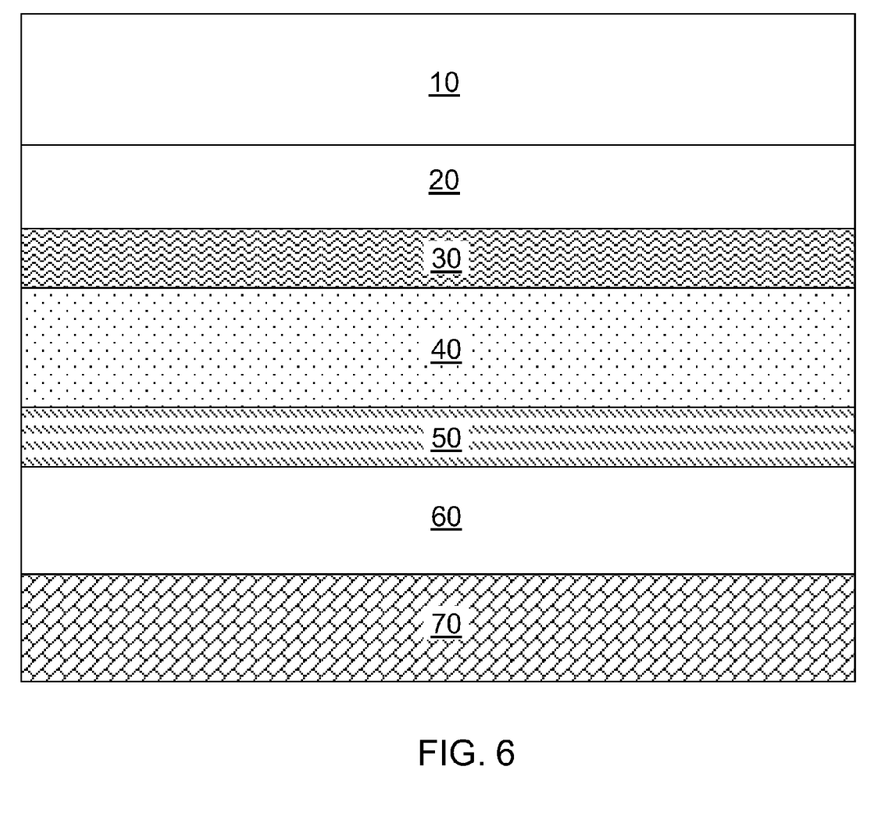
FIG. 6 is a vertical cross-sectional view of an exemplary photovoltaic device structure according to an embodiment of the present invention.

FIG. 6 is a vertical cross-sectional view of an exemplary photovoltaic device structure according to an embodiment of the present invention.

The substrate 10 is a structure that provides mechanical support to the photovoltaic structure. The substrate 10 is transparent in the range of electromagnetic radiation at which photogeneration of electrons and holes occur within the photovoltaic structure. If the prior art photovoltaic device is a solar cell, the substrate 10 can be optically transparent, i.e., transparent in the visible electromagnetic spectral range having a wavelength from 400 nm to 800 nm. The substrate 10 can be a glass substrate. The thickness of the substrate 10 can be from 50 microns to 3 mm, although lesser and greater thicknesses can also be employed.

The transparent conductive material layer 20 includes a material that is transparent in the range of electromagnetic radiation at which photogeneration of electrons and holes occur within the photovoltaic device structure. If the photovoltaic device structure is employed as a solar cell, the transparent conductive material layer 20 can be optically transparent. For example, the transparent conductive material layer 20 can include a transparent conductive oxide such as a fluorine-doped tin oxide ($SnO_2$:F), an aluminum-doped zinc oxide (ZnO:Al), or indium tin oxide. The thickness of the transparent conductive material layer 20 can be from 100 nm to 3 microns, although lesser and greater thicknesses can also be employed.

The p-doped semiconductor layer 30 includes a microcrystalline p-doped hydrogenated semiconductor-containing material that has a higher concentration of free charge carriers, i.e., holes, than amorphous or microcrystalline p-doped hydrogenated semiconductor-containing materials known in the art. The microcrystalline p-doped hydrogenated semiconductor-containing material is deposited in a process chamber containing a semiconductor-material-containing reactant gas a carrier gas.

The carrier gas includes $H_2$ (hydrogen gas) and at least one inert gas, which can be He, Ne, Ar, Kr, Xe, or a combination thereof. Hydrogen atoms in the hydrogen gas within the carrier gas are incorporated into the deposited material to form the microcrystalline p-doped hydrogenated semiconductor-containing material of the p-doped semiconductor layer 30. The thickness of the p-doped semiconductor layer 30 can be from 3 nm to 30 nm, although lesser and greater thicknesses can also be employed.

The p-doped semiconductor layer 30 can include a silicon-containing material, a germanium-containing material, or a compound semiconductor material. In one embodiment, the p-doped semiconductor layer 30 includes a silicon-containing material. The microcrystalline p-doped hydrogenated semiconductor-containing material can be a microcrystalline p-doped hydrogenated silicon-carbon alloy. In this case, a carbon-containing gas can be flown into the processing chamber during deposition of the microcrystalline p-doped hydrogenated silicon-carbon alloy. The atomic concentration of carbon in the microcrystalline p-doped hydrogenated silicon-carbon alloy of the p-doped semiconductor layer can be from 1% to 50%, and preferably from 5% to 30%. In this case, the band gap of the p-doped semiconductor layer 30 can be from 1.8 eV to 2.5 eV.

The intrinsic semiconductor layer 40 includes an intrinsic hydrogenated semiconductor-containing material. The intrinsic hydrogenated semiconductor-containing material is deposited in a process chamber containing a semiconductor-material-containing reactant gas a carrier gas including hydrogen. Hydrogen atoms in the hydrogen gas within the carrier gas are incorporated into the deposited material to form the intrinsic hydrogenated semiconductor-containing material of the intrinsic semiconductor layer 40. The intrinsic hydrogenated semiconductor-containing material can be amorphous or microcrystalline. Typically, the intrinsic hydrogenated semiconductor-containing material is amorphous. The thickness of the intrinsic semiconductor layer 40 depends on the collection length of electrons and holes in the intrinsic hydrogenated semiconductor-containing material. Typically, the thickness of the intrinsic semiconductor layer 40 is from 100 nm to 1 micron, although lesser and greater thicknesses can also be employed.

The intrinsic semiconductor layer 40 can include a silicon-containing material, a germanium-containing material, or a compound semiconductor material. In one embodiment, the intrinsic semiconductor layer 40 includes a silicon-containing material. The semiconductor material of the intrinsic semiconductor layer 40 can be amorphous intrinsic silicon.

The n-doped semiconductor layer 50 includes an n-doped semiconductor-containing material. The n-doped semiconductor layer 50 can be a hydrogenated material, in which case an n-doped hydrogenated semiconductor-containing material is deposited in a process chamber containing a semiconductor-material-containing reactant gas a carrier gas including hydrogen. The n-type dopants in the n-doped semiconductor layer 50 can be introduced by in-situ doping. Alternately, the n-type dopants in the n-doped semiconductor layer 50 can be introduced by subsequent introduction of dopants employing any method known in the art. The n-doped semiconductor layer 50 can be amorphous or microcrystalline. The thickness of the n-doped semiconductor layer 50 can be from 5 nm to 50 nm, although lesser and greater thicknesses can also be employed.

The n-doped semiconductor layer 50 can include a silicon-containing material, a germanium-containing material, or a compound semiconductor material. In one embodiment, the n-doped semiconductor layer 50 includes a silicon-containing material. The semiconductor material of the n-doped semiconductor layer 50 can be amorphous n-doped silicon.

The first back reflector layer 60 includes a transparent conductive material that is transparent in the range of electromagnetic radiation at which photogeneration of electrons and holes occur within the photovoltaic device structure. If the photovoltaic device structure is employed as a solar cell, the first back reflector layer 60 can be optically transparent. For example, the first back reflector layer 60 can include a transparent conductive oxide such as a fluorine-doped tin oxide ($SnO_2$:F), an aluminum-doped zinc oxide (ZnO:Al), or indium tin oxide. Since such transparent conductive oxide materials are n-type materials, the contact between the first back reflector layer 60 and the n-doped semiconductor layer 50 is Ohmic, and as such, the contact resistance between the first back reflector layer 60 and the n-doped semiconductor layer 50 is negligible. The thickness of the back reflector layer 60 can be from 25 nm to 250 nm, although lesser and greater thicknesses can also be employed.

The second back reflector layer 70 includes a metallic material. Preferably, the metallic material has a high reflectivity in the range of electromagnetic radiation at which photogeneration of electrons and holes occur within the photovoltaic device structure. The metallic material can include silver, aluminum, or an alloy thereof. The thickness of the second back reflector layer 70 can be from 100 nm to 1 micron, although lesser and greater thicknesses can also be employed.

Figure 7A:
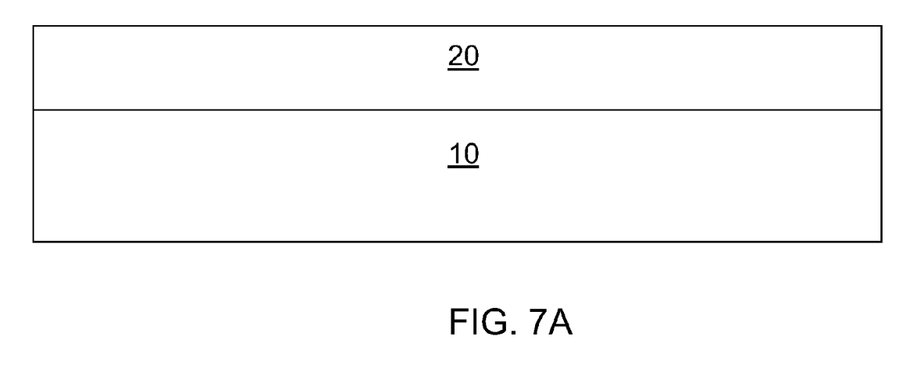
FIG. 7A is a vertical cross-sectional view of an exemplary photovoltaic device structure after formation of a transparent conductive material layer according to an embodiment of the present invention.
Figure 7B:
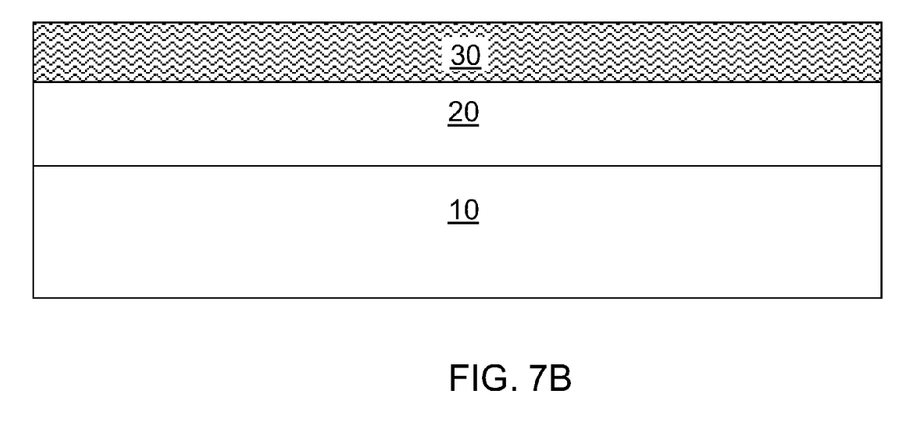
FIG. 7B is a vertical cross-sectional view of an exemplary photovoltaic device structure after formation of a p-doped semiconductor layer according to an embodiment of the present invention.
Figure 7C:
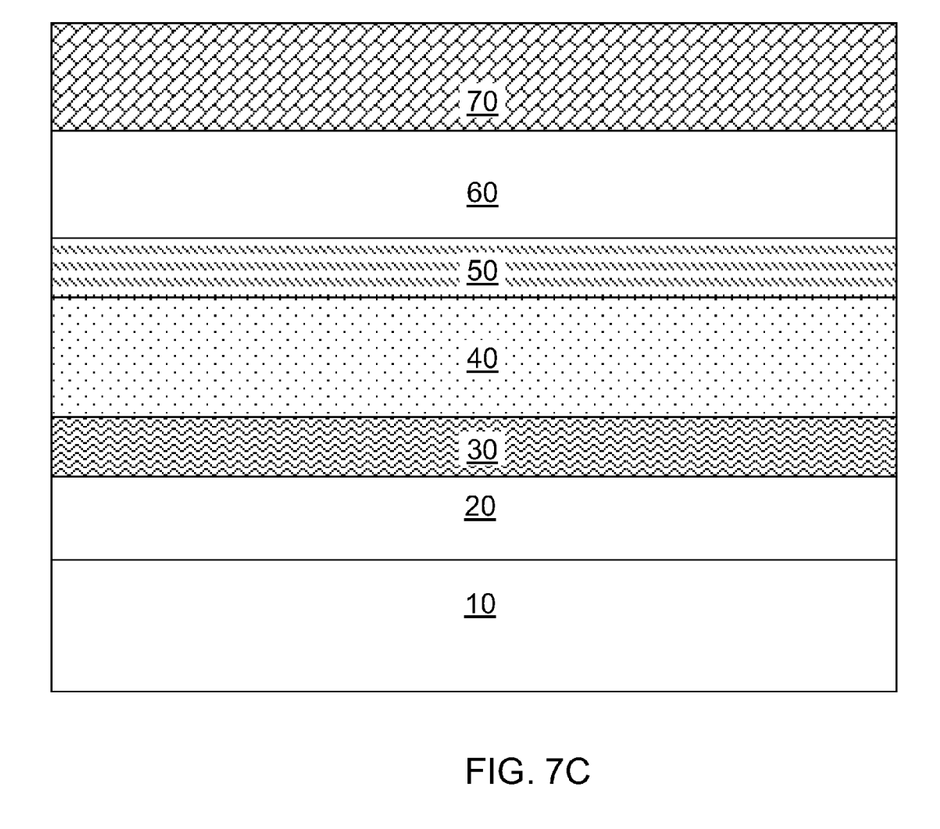
FIG. 7C is a vertical cross-sectional view of an exemplary photovoltaic device structure after formation of back reflector layers according to an embodiment of the present invention.

FIG. 7A-7C are sequential vertical cross-sectional views that illustrate a manufacturing process for forming the exemplary photovoltaic device structure of FIG. 6. Referring to FIG. 7A, the substrate 10 includes a material that is transparent in the range of electromagnetic radiation at which photogeneration of electrons and holes occur within the photovoltaic structure as describe above. The transparent conductive material layer 20 is formed on the substrate 10, for example, by deposition.

Referring to FIG. 7B, the p-doped semiconductor layer 30 is deposited in a process chamber containing a semiconductor-material-containing reactant gas and a carrier gas. The p-doped semiconductor layer 30 is formed on the transparent conductive material layer 20 in the presence of the semiconductor-material-containing reactant and the carrier gas in a chemical vapor deposition. The chemical vapor deposition process can be plasma enhanced chemical vapor process (PECVD) performed at a deposition temperature from 50° C. to 400° C., and preferably from 100° C. to 350° C., and at a pressure from 0.1 Torr to 10 Torr, and preferably from 0.2 Torr to 5 Torr. The partial pressure of the at least one inert gas can be from 0.02 Torr to 8 Torr. The partial pressure of hydrogen can be from 0.02 Torr to 8 Torr.

The semiconductor-material-containing reactant gas includes at least one atom of silicon, germanium, or a component semiconductor material of a compound semiconductor material such as GaAs. In case the p-doped semiconductor layer 30 includes a p-doped compound semiconductor material, the semiconductor-material-containing reactant gas can be a mixture of a two semiconductor-material-containing reactant gases such as a mixture of a first gas containing a Group II or Group III atom and a second gas containing a Group IV or Group V gas. In case the p-doped semiconductor layer 30 includes a p-doped silicon-containing material, the semiconductor-material-containing reactant gas can include at least one of $SiH_4$, $Si_2H_6$, $SiH_2Cl_2$, $SiHCl_3$, and $SiCl_4$. In case the p-doped semiconductor layer 30 includes a p-doped germanium-containing material, the semiconductor-material-containing reactant gas can include at least one of $GeH_4$, $Ge_2H_6$, $GeH_2Cl_2$, and $GeCl_4$.

The carrier gas includes hydrogen and at least one inert gas, which can be He, Ne, Ar, Xe, Kr, or a mixture thereof. In one embodiment, the carrier gas consists of hydrogen gas and helium gas. Hydrogen atoms in the hydrogen gas within the carrier gas are incorporated into the deposited material to form a microcrystalline p-doped hydrogenated semiconductor-containing material of the p-doped semiconductor layer 30. The ratio of the flow rate of the semiconductor-material-containing reactant gas to the carrier gas can be from 1:2 to 1:1000, and typically from 1:10 to 1:200, although lesser and greater ratios can also be employed. Within the carrier gas, the ratio of hydrogen gas to the at least one inert gas can be from 1:5 to 5:1, and typically from 1:2 to 2:1, although lesser and greater ratios can also be employed. The actual flow rate of each gas is determined based on the size of the process chamber and the target pressure during the deposition process.

The p-type dopants in the microcrystalline p-doped hydrogenated semiconductor-containing material of the p-doped semiconductor layer 30 can be introduced by in-situ doping. For example, diborane ($B_2H_6$) gas can be flown into the processing chamber concurrently with the semiconductor-material-containing reactant gas if the p-doped semiconductor layer 30 includes a p-doped silicon-containing material or a p-doped germanium-containing material. If the p-doped semiconductor layer 30 includes a p-doped compound semiconductor material, the ratio of the flow rate of the reactant gas for the Group II or Group III material to the flow rate of the reactant gas for the group VI or Group V material can be increased to induce p-type doping. Alternately, the p-type dopants in the microcrystalline p-doped hydrogenated semiconductor-containing material can be introduced by subsequent introduction of dopants employing any method known in the art such as plasma doping, ion implantation, and/or outdiffusion from a disposable diffusion source (e.g., borosilicate glass).

The presence of the at least one inert gas during deposition of the material of the p-doped semiconductor layer 30 increases the concentration of free charge carriers of the p-doped semiconductor layer 30. The increase in the concentration of free charge carriers results in a downward shift in the Fermi level, i.e., a shift toward the valence band, within the p-doped semiconductor layer 30. Consequently, the conductivity of the p-doped semiconductor layer 30 increases relative to amorphous or microcrystalline p-doped hydrogenated semiconductor-containing materials known in the art, which are deposited in the absence of any inert gas.

The microcrystalline p-doped hydrogenated semiconductor-containing material of the p-doped semiconductor layer 30 can be a microcrystalline p-doped hydrogenated silicon-carbon alloy. In this case, a carbon-containing gas can be flown into the processing chamber during deposition of the microcrystalline p-doped hydrogenated silicon-carbon alloy. The carbon-containing gas can be flown into the processing chamber either continuously or intermittently. The carbon-containing gas can be any hydrocarbon gas including, but not limited to, $CH_4$, $C_2H_2$, $C_2H_4$, and $C_2H_6$. As discussed above, the atomic concentration of carbon in the microcrystalline p-doped hydrogenated silicon-carbon alloy of the p-doped semiconductor layer can be from 1% to 90%, and preferably from 5% to 30%.

Referring to FIG. 7C, the intrinsic semiconductor layer 40 is deposited on the p-doped semiconductor layer 30, for example, by plasma-enhanced chemical vapor deposition. In case the intrinsic semiconductor layer 40 includes an intrinsic hydrogenated semiconductor-containing material, hydrogen gas is supplied into the process chamber concurrently with a semiconductor-material-containing reactant gas. The intrinsic hydrogenated semiconductor-containing material can be amorphous or microcrystalline.

The n-doped semiconductor layer 50 is deposited on the intrinsic semiconductor layer 40, for example, by plasma-enhanced chemical vapor deposition. In case the n-doped semiconductor layer 50 includes an n-doped hydrogenated semiconductor-containing material, hydrogen gas is supplied into the process chamber concurrently with a semiconductor-material-containing reactant gas. The material of the n-doped semiconductor layer 50 can be amorphous or microcrystalline.

The n-type dopants in the n-doped semiconductor layer 50 can be introduced by in-situ doping. For example, phosphene ($PH_3$) gas or arsine ($AsH_3$) gas can be flown into the processing chamber concurrently with the semiconductor-material-containing reactant gas if the n-doped semiconductor layer 50 includes an n-doped silicon-containing material or an n-doped germanium-containing material. If the n-doped semiconductor layer 50 includes an n-doped compound semiconductor material, the ratio of the flow rate of the reactant gas for the Group II or Group III material to the flow rate of the reactant gas for the group VI or Group V material can be decreased to induce n-type doping. Alternately, the n-type dopants in the n-doped semiconductor layer 50 can be introduced by subsequent introduction of dopants employing any method known in the art.

The first back reflector layer 60 is deposited on the n-doped semiconductor layer 50 employing methods known in the art. The first back reflector layer 60 includes a transparent conductive material. The second back reflector layer 70 is subsequently deposited on the first back reflector layer 70, for example, by electroplating, electroless plating, physical vapor deposition, chemical vapor deposition, vacuum evaporation, or a combination thereof. The second back reflector layer 70 can be a metallic layer.

Figure 8:
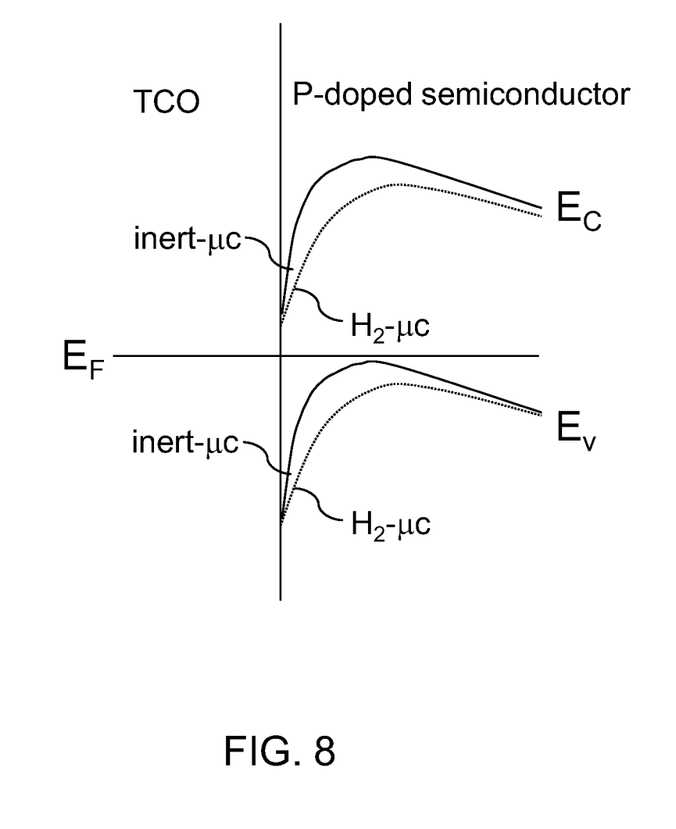
FIG. 8 is a band diagram of a transparent conductive material and the p-doped semiconductor layer in the exemplary photovoltaic device structure according to an embodiment of the present invention.

One advantage of the presence of helium during the deposition of the p-doped semiconductor layer 30 is illustrated in FIG. 8, which is a band diagram of the transparent conductive material layer 20 and the p-doped semiconductor layer 30 in the exemplary photovoltaic device structure of FIGS. 6 and 7C.

The Fermi level shift toward the valence band in the p-doped semiconductor layer 30 due to the presence of the at least one inert gas during deposition of the microcrystalline p-doped hydrogenated semiconductor-containing material affects the band structure of the p-doped semiconductor layer 30. Specifically, the conduction band and the valence band of the p-doped semiconductor layer 30 shifts upward within the p-doped semiconductor layer 30 except near an interface with the intrinsic semiconductor layer 40. At the junction of the transparent conductive material layer 20 (labeled "TCO") and the p-doped semiconductor layer 30, the shift in the Fermi level is manifested as a change in the energy level of the conduction band $E_c$ and the valence band $E_v$. The conduction band and the valence band of prior art photovoltaic device structure of FIG. 1 are labeled as "$H_2$-μc," denoting a microcrystalline structure formed in hydrogen carrier gas ambient, while the conduction band and the valence band of photovoltaic device structure of FIGS. 6 and 7C are labeled as "inert-μc," denoting a microcrystalline structure formed in a carrier gas including at least one inert gas. Such a band shift increases the built-in potential, and results in the increase of the Voc.

As the band diagram illustrates, not only does the concentration of free holes increase in the p-doped semiconductor layer 30, the tunneling of holes through the Schottky barrier at the interface between the transparent conductive material layer 20 and the p-doped semiconductor layer 30 increases exponentially with the shift of the Fermi level in the p-doped semiconductor layer. Because the resistance due to the Schottky barrier at the interface between the transparent conductive material layer 20 and the p-doped semiconductor layer 30 is the predominant component of a series resistance in properly constructed (i.e., non-defective) photovoltaic devices, the increased tunneling current through the Schottky barrier in a dramatic reduction in the series resistance in the photovoltaic device according to the present invention compared to prior art photovoltaic devices. For example, while prior art photovoltaic device structures employing an amorphous hydrogenated carbon-containing silicon alloy for a p-doped semiconductor layer has a series resistance from 20 Ohms-cm$^2$ to 30 Ohms-cm$^2$, and prior art photovoltaic device structures employing a microcrystalline hydrogenated carbon-containing silicon alloy for a p-doped semiconductor layer has a series resistance from 10 Ohms-cm$^2$ to 15 Ohms-cm$^2$, photovoltaic device structures according to the present invention can have a series resistance less than 9 Ohms-cm$^2$. Many samples of photovoltaic device structures according to the present invention demonstrated a series resistance from 5 Ohms-cm$^2$ to 9 Ohms-cm$^2$.

Figure 9:
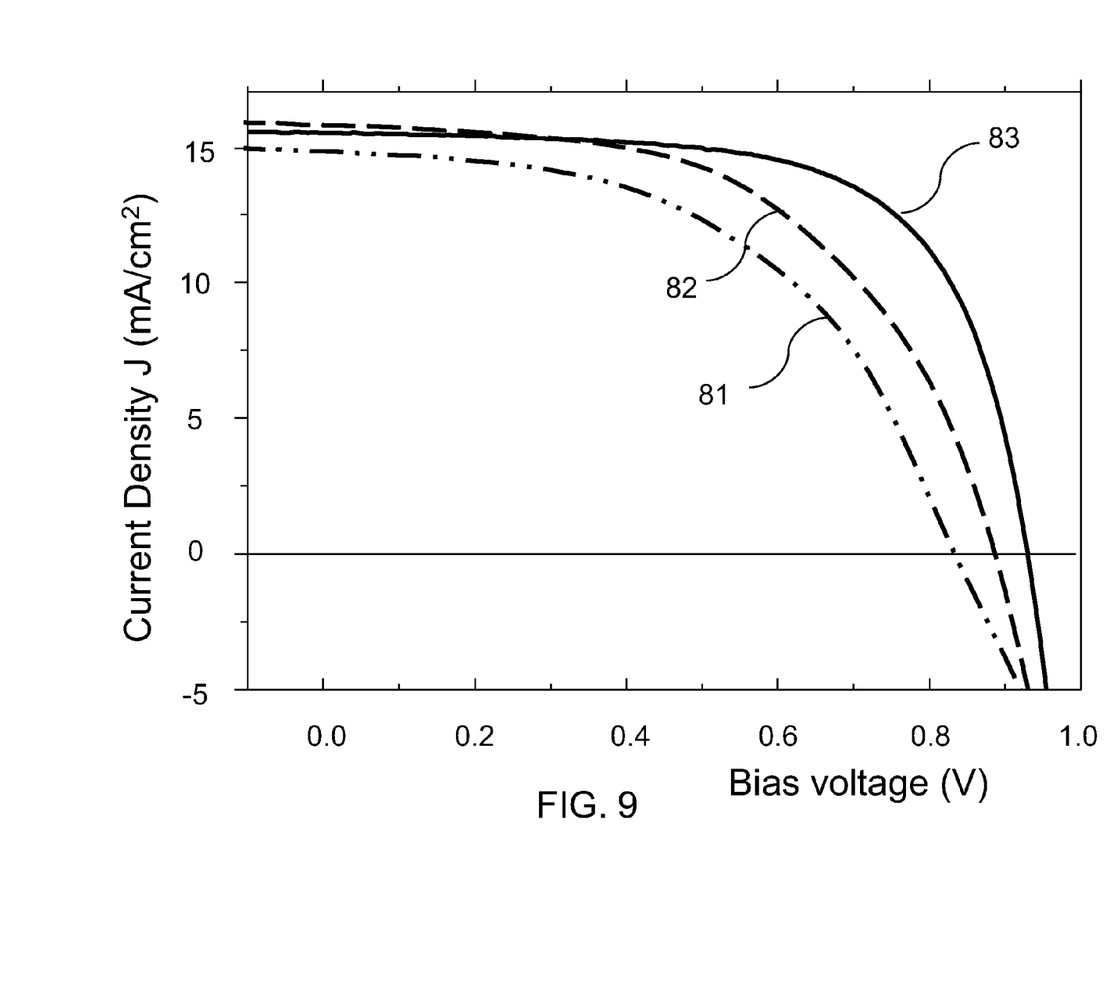
FIG. 9 is a graph comparing an I-V curve of the exemplary photovoltaic device structure according to the present invention with other I-V curves of prior art photovoltaic device structures.

The reduction in the series resistance has a significant effect on the efficiency of the photovoltaic device according to the present invention. Referring to FIG. 9, a graph compares an I-V curve of the exemplary photovoltaic device structure according to the present invention with other I-V curves of prior art photovoltaic device structures. Specifically, a first I-V curve labeled "81" refers to an I-V curve of a prior art photovoltaic device of FIG. 1 in which the p-doped semiconductor layer 130 employs an amorphous p-doped hydrogenated silicon-carbon alloy deposited in a carrier gas consisting of hydrogen gas. A second I-V curve labeled "82" refers to an I-V curve of a prior art photovoltaic device of FIG. 1 in which the p-doped semiconductor layer 130 employs a microcrystalline p-doped hydrogenated silicon-carbon alloy deposited in a carrier gas consisting of hydrogen gas. A third I-V curve labeled "83" refers to an I-V curve of a photovoltaic device of FIGS. 6 and 7C in which the p-doped semiconductor layer 30 employs a microcrystalline p-doped hydrogenated silicon-carbon alloy deposited in a carrier gas including hydrogen gas and helium gas.

The fill factor of the third I-V curve 83 is greater than the fill factor of the first I-V curve 81 and the fill factor of the second I-V curve 82. The efficiency η of the prior art photovoltaic device of FIG. 1 that exhibits the first I-V curve 81 is about 6.0%, while the efficiency η of the photovoltaic device of FIGS. 6 and 7C according to the present invention, which exhibits the third I-V curve 83, is about 8.6%. Thus, the presence of the at least one inert gas during the deposition of the p-doped semiconductor layer 30 induces a significant increase in the efficiency of the photovoltaic device.

Figure 10A:
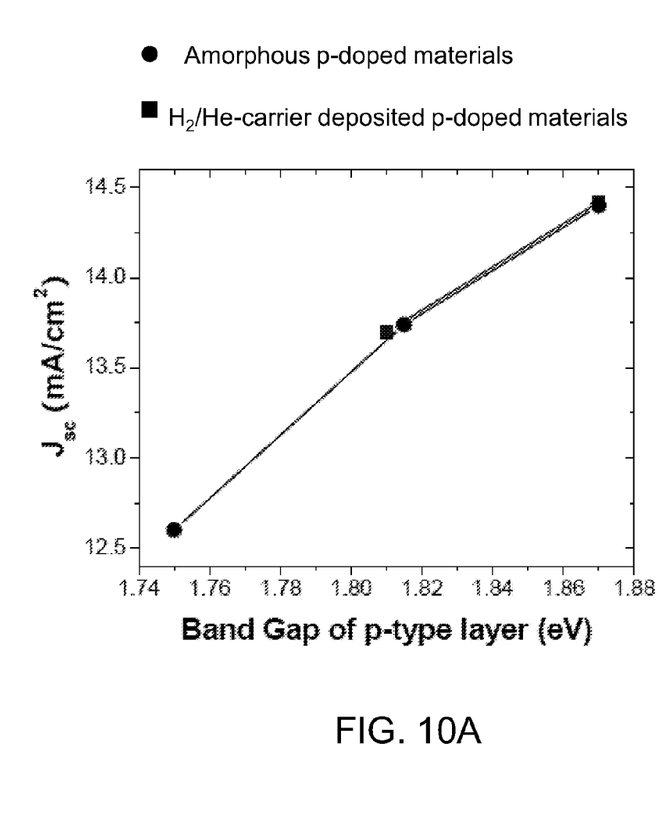
FIG. 10A is a graph comparing the short circuit current density for the exemplary photovoltaic device structure according to the present invention with the short circuit current density for prior art photovoltaic device structures of FIG. 1 as a function of the band gap width of the p-doped materials.
Figure 10B:
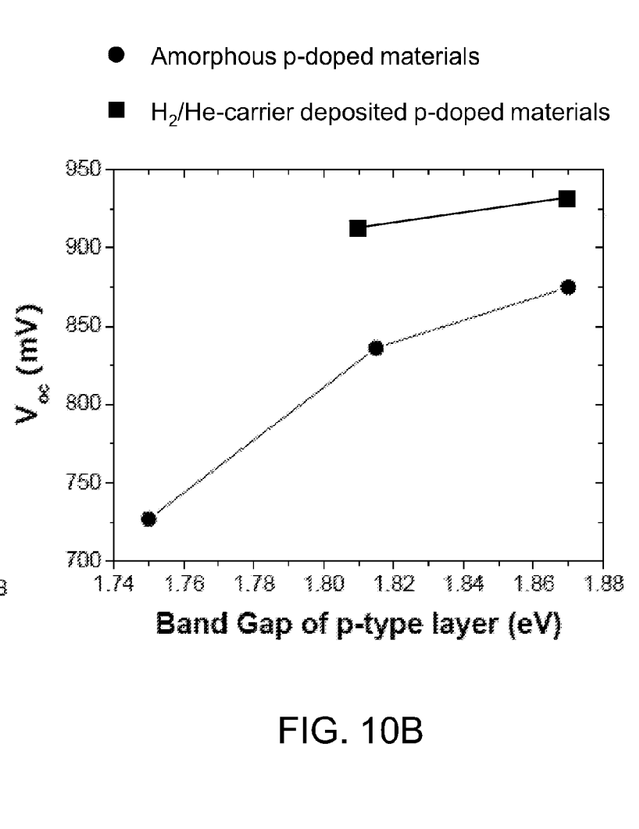
FIG. 10B is a graph comparing the open circuit voltage for the exemplary photovoltaic device structure according to the present invention with the open circuit voltage for prior art photovoltaic device structures of FIG. 1 as a function of the band gap width of the p-doped materials.
Figure 10C:
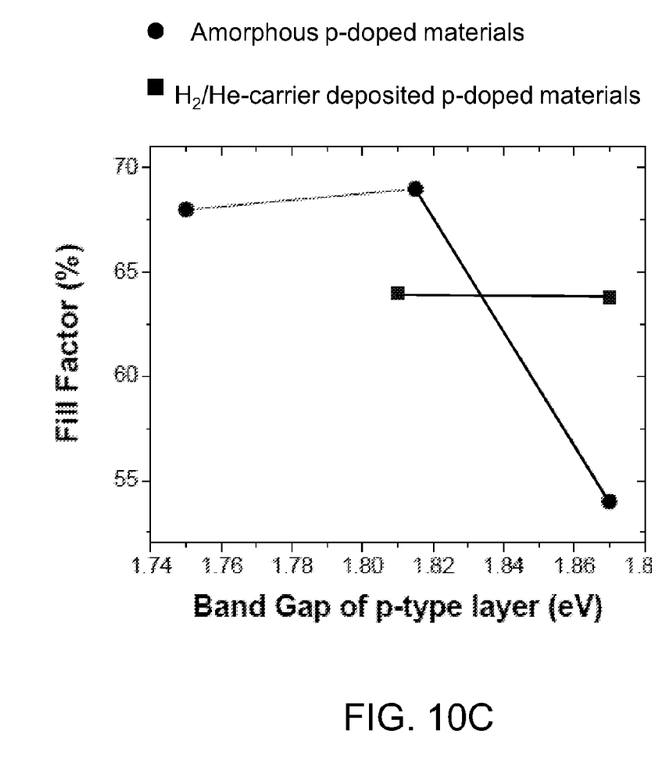
FIG. 10C is a graph comparing the fill factor for the exemplary photovoltaic device structure according to the present invention with the fill factor for prior art photovoltaic device structures of FIG. 1 as a function of the band gap width of the p-doped materials.

The performance metrics of samples of the photovoltaic device structure according to the present invention are compared with the corresponding performance metrics of samples of prior art photovoltaic devices in FIGS. 10A-10C. Throughout FIGS. 10A-10C, dark circles represent data point for prior art photovoltaic devices employing an amorphous p-doped material deposited in a carrier gas employing only hydrogen, and dark squares represent data points for photovoltaic devices employing a microcrystalline p-doped material deposited in a carrier gas including a mixture of hydrogen gas and helium gas according to the present invention. The test data encompasses band gap energy range from 1.74 eV to 1.88 eV.

FIG. 10A is a graph comparing the short circuit current density $J_{sc}$ for the exemplary photovoltaic device structure according to the present invention with the short circuit current density $J_{sc}$ for prior art photovoltaic device structures of FIG. 1 as a function of the band gap width of the p-doped materials. FIG. 10A shows that the exemplary photovoltaic device structure according to the present invention provides short circuit current densities $J_{sc}$ that are substantially identical with corresponding short circuit current densities for prior art photovoltaic device structures of FIG. 1 for the same band gap energy.

FIG. 10B is a graph comparing the open circuit voltage $V_{oc}$ for the exemplary photovoltaic device structure according to the present invention with the open circuit voltages $V_{oc}$ for prior art photovoltaic device structures of FIG. 1 as a function of the band gap width of the p-doped materials. FIG. 10B shows that the exemplary photovoltaic device structure according to the present invention provides a greater open circuit voltage $V_{oc}$ than corresponding open circuit voltage $V_{oc}$ for prior art photovoltaic device structures of FIG. 1 for the same band gap energy. Particularly, the open-circuit voltage of the photovoltaic device is greater than 900 mV when the band gap energy of the p-doped semiconductor material is greater than 1.80V, while the prior art photovoltaic device structure has open circuit voltages $V_{oc}$ that are less than 900 mV.

FIG. 10C is a graph comparing the fill factor FF for the exemplary photovoltaic device structure according to the present invention with the fill factor FF for prior art photovoltaic device structures of FIG. 1 as a function of the band gap width of the p-doped materials. The fill factor FF for the exemplary photovoltaic device structure according to the present invention is greater than fill factor FF for the prior art photovoltaic device structure of FIG. 1 if the band gap of the p-doped semiconductor layer is greater than 1.85 eV. In this case, the fill factor FF for the exemplary photovoltaic device structure according to the present invention is greater than 60%, while the fill factor FF for the prior art photovoltaic device structure of FIG. 1 is less than 60%. The differential in the fill factor FF between the exemplary photovoltaic device structure according to the present invention and the fill factor FF for prior art photovoltaic device structures of FIG. 1 is expected to grow with increasing band gap energy above 1.85 eV because it is known that the fill factor FF for prior art photovoltaic device structures of FIG. 1 decreases rapidly with increasing band gap energy above 1.85 eV.

Figure 10D:
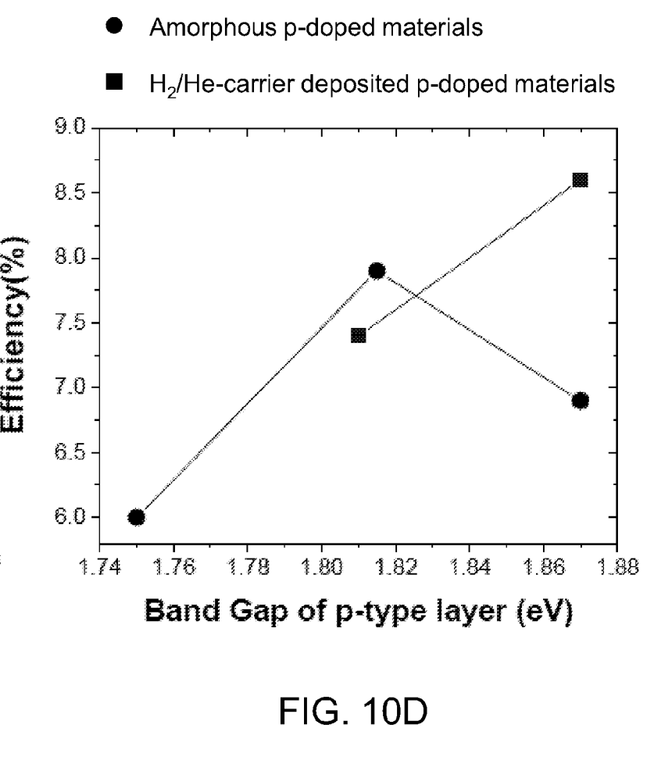
FIG. 10D is a graph comparing the efficiency for the exemplary photovoltaic device structure according to the present invention with the efficiency for prior art photovoltaic device structures of FIG. 1 as a function of the band gap width of the p-doped materials.

FIG. 10D is a graph comparing the efficiency r for the exemplary photovoltaic device structure according to the present invention with the efficiency η for prior art photovoltaic device structures of FIG. 1 as a function of the band gap width of the p-doped materials. The efficiency η for the exemplary photovoltaic device structure according to the present invention is greater than efficiency η for the prior art photovoltaic device structure of FIG. 1 if the band gap of the p-doped semiconductor layer is greater than 1.85 eV. In this case, the efficiency η for the exemplary photovoltaic device structure according to the present invention can exceed 8.0%, while the efficiency r for the prior art photovoltaic device structure of FIG. 1 does not exceed 8.0%. The differential in the efficiency η between the exemplary photovoltaic device structure according to the present invention and the fill factor FF for prior art photovoltaic device structures of FIG. 1 is expected to grow with increasing band gap energy above 1.85 eV because it is known that the fill factor FF for prior art photovoltaic device structures of FIG. 1 decreases rapidly with increasing band gap energy above 1.85 eV.

While the present invention has been particularly shown and described with respect to preferred embodiments thereof, it will be understood by those skilled in the art that the foregoing and other changes in forms and details can be made without departing from the spirit and scope of the present invention. It is therefore intended that the present invention not be limited to the exact forms and details described and illustrated, but fall within the scope of the appended claims.

What is claimed is:

1. A photovoltaic device comprising:
a transparent conductive material layer;
a p-doped semiconductor layer comprising a microcrystalline p-doped hydrogenated semiconductor-containing material and contacting said transparent conductive material layer;
an intrinsic semiconductor layer comprising an amorphous intrinsic hydrogenated semiconductor-containing material and contacting said p-doped semiconductor layer; and
an n-doped semiconductor layer comprising an amorphous n-doped hydrogenated semiconductor-containing material and contacting said intrinsic semiconductor layer, wherein a series resistance of said photovoltaic device is equal to, or less than, 9 Ohms-cm$^2$.

2. The photovoltaic device of claim 1, wherein said transparent conductive material layer includes an aluminum-doped zinc oxide material.

3. The photovoltaic device of claim 1, wherein said p-doped semiconductor layer includes a p-doped microcrystalline silicon-carbon alloy.

4. The photovoltaic device of claim 3, wherein an open-circuit voltage of said photovoltaic device is greater than 900 mV.

5. The photovoltaic device of claim 3, wherein a band gap of said p-doped semiconductor layer is greater than 1.85 eV, and a fill factor of said photovoltaic device is greater than 60%.

6. The photovoltaic device of claim 3, wherein a band gap of said p-doped semiconductor layer is greater than 1.85 eV, and efficiency of said photovoltaic device is greater than 8%.

7. The photovoltaic device of claim 3, wherein said p-doped microcrystalline silicon-carbon alloy includes a microcrystalline hydrogenated p-doped silicon-carbon alloy.

8. The photovoltaic device of claim 1, wherein said intrinsic semiconductor layer includes hydrogenated amorphous intrinsic silicon.

9. The photovoltaic device of claim 1, wherein said n-doped semiconductor layer includes hydrogenated amorphous n-doped silicon.

10. The photovoltaic device of claim 1, wherein said microcrystalline p-doped hydrogenated semiconductor-containing material comprises carbon atoms.

11. The photovoltaic device of claim 10, wherein an atomic concentration of carbon in said microcrystalline p-doped hydrogenated semiconductor-containing material is in a range from 1% to 50%.

12. The photovoltaic device of claim 10, wherein an atomic concentration of carbon in said microcrystalline p-doped hydrogenated semiconductor-containing material is in a range from 5% to 30%.

13. The photovoltaic device of claim 1, wherein said p-doped semiconductor layer has a thickness in a range from 3 nm to 30 nm.

14. The photovoltaic device of claim 1, wherein said series resistance of said photovoltaic device is within a range from 5 Ohms-cm$^2$ to 9 Ohms-cm$^2$.

15. The photovoltaic device of claim 1, wherein said p-doped semiconductor layer consists of said microcrystalline p-doped hydrogenated semiconductor-containing material.

* * * * *